US011764543B2

(12) United States Patent
Iakovlev et al.

(10) Patent No.: US 11,764,543 B2
(45) Date of Patent: Sep. 19, 2023

(54) INTEGRATION OF MODULATOR AND LASER IN A SINGLE CHIP

(71) Applicant: MELLANOX TECHNOLOGIES, LTD., Yokneam (IL)

(72) Inventors: Vladimir Iakovlev, Ecublens (CH); Yuri Berk, Kiryat Tivon (IL); Paraskevas Bakopoulos, Ilion (GR); Elad Mentovich, Tel Aviv (IL)

(73) Assignee: MELLANOX TECHNOLOGIES, LTD., Yokneam (IL)

(*) Notice: Subject to any disclaimer, the term of this patent is extended or adjusted under 35 U.S.C. 154(b) by 377 days.

(21) Appl. No.: 16/989,907

(22) Filed: Aug. 11, 2020

(65) Prior Publication Data

US 2021/0336418 A1    Oct. 28, 2021

(30) Foreign Application Priority Data

Apr. 23, 2020    (GR) .............................. 20200100207

(51) Int. Cl.
*H01S 5/183*    (2006.01)
*H01S 5/026*    (2006.01)
(Continued)

(52) U.S. Cl.
CPC .......... *H01S 5/18302* (2013.01); *G02F 1/212* (2021.01); *H01S 5/0071* (2013.01);
(Continued)

(58) Field of Classification Search
CPC .. H01S 5/18302; H01S 5/0085; H01S 5/0265; H01S 5/02255; H01S 5/18–187; H01S 5/183–18397
See application file for complete search history.

(56) References Cited

U.S. PATENT DOCUMENTS 6,522,793 B1    2/2003  Szilagyi et al.
7,627,018 B1 *  12/2009  Guilfoyle .............  G02B 6/4214
                                                    372/102
(Continued)

FOREIGN PATENT DOCUMENTS

DE    102009036033 A1    2/2011
EP         2696229 A     2/2014
(Continued)

OTHER PUBLICATIONS

Moeneclaey et al., "A 64 GB/s PAM-4 Linear Optical Receiver," Conference Paper, Optical Fiber Communication Conference, pp. 1-3, year 2015.
(Continued)

*Primary Examiner* — Sean P Hagan
(74) *Attorney, Agent, or Firm* — KLIGER & ASSOCIATES PATENT ATTORNEYS LTD

(57) ABSTRACT

An optoelectronic device includes a substrate and first thin film layers disposed on the substrate and patterned to define a vertical-cavity surface-emitting laser (VCSEL), which is configured to emit optical radiation along an optical axis perpendicular to the substrate. Second thin film layers are disposed over the first thin film layers and are patterned to define an optical modulator in which the optical radiation propagates in a direction parallel to the substrate, and an optical coupler configured to couple the optical radiation from the VCSEL into the optical modulator.

18 Claims, 2 Drawing Sheets

(51) Int. Cl.
*H01S 5/02255* (2021.01)
*H01S 5/343* (2006.01)
*G02F 1/21* (2006.01)
*H01S 5/00* (2006.01)
*H01S 5/30* (2006.01)

(52) U.S. Cl.
CPC .......... *H01S 5/0085* (2013.01); *H01S 5/0265* (2013.01); *H01S 5/02255* (2021.01); *H01S 5/34313* (2013.01); *G02F 2203/10* (2013.01); *H01S 5/18308* (2013.01); *H01S 5/18341* (2013.01); *H01S 5/3095* (2013.01)

(56) References Cited

U.S. PATENT DOCUMENTS

| | | | |
|---|---|---|---|
| 7,811,844 | B2 | 10/2010 | Carothers et al. |
| 8,358,419 | B2 | 1/2013 | Walters |
| 8,378,496 | B2 | 2/2013 | Schrank et al. |
| 8,741,684 | B2 | 6/2014 | Bogaerts et al. |
| 8,780,431 | B1 | 7/2014 | Kekatpure et al. |
| 8,837,951 | B2 | 9/2014 | Winston |
| 9,281,661 | B2 | 3/2016 | Su |
| 9,762,025 | B2 | 9/2017 | Johnson et al. |
| 10,396,527 | B2 | 8/2019 | Sirbu et al. |
| 2002/0131464 | A1* | 9/2002 | Sirbu .................. H01S 5/18308 372/45.01 |
| 2002/0179929 | A1* | 12/2002 | Takahashi ............... G02F 1/017 257/184 |
| 2010/0278474 | A1* | 11/2010 | Beausoleil ............ H01S 5/1032 359/278 |
| 2012/0208174 | A1 | 8/2012 | Galush |
| 2012/0287429 | A1 | 11/2012 | Van Dorpe et al. |
| 2013/0020675 | A1 | 1/2013 | Kireev et al. |
| 2013/0148126 | A1 | 6/2013 | Walters et al. |
| 2013/0172207 | A1 | 7/2013 | Dai et al. |
| 2014/0106469 | A1 | 4/2014 | Wu et al. |
| 2014/0301694 | A1 | 10/2014 | Lee et al. |
| 2014/0348468 | A1 | 11/2014 | Lagziel et al. |
| 2015/0050015 | A1 | 2/2015 | Levy et al. |
| 2017/0033534 | A1 | 2/2017 | Chung et al. |
| 2017/0047708 | A1 | 2/2017 | Johnson |
| 2017/0256915 | A1* | 9/2017 | Ghosh ................... H01S 5/1833 |
| 2018/0081204 | A1* | 3/2018 | Ma ........................... G02F 1/035 |
| 2019/0148913 | A1* | 5/2019 | Lebby ................. H01S 5/18308 372/50.11 |

FOREIGN PATENT DOCUMENTS

| | | |
|---|---|---|
| WO | 2010083922 A1 | 7/2010 |
| WO | 2011162719 A1 | 12/2011 |
| WO | 2014165836 A1 | 10/2014 |

OTHER PUBLICATIONS

Burla et al., "500 GHz plasmonic Mach-Zehnder modulator enabling sub-THz microwave photonics," APL Photonics 4, 056106, pp. 1-12, year 2019.

Yang et al., "Integration of an O-band VCSEL on silicon photonics with polarization maintenance and waveguide coupling", Optics Express, vol. 25, No. 5, pp. 5758-5771, Mar. 6, 2017.

Heni et al., "Plasmonic IQ modulators with attojoule per bit electrical energy consumption", Nature Communications, vol. 10, issue 1, p. 10, pp. 1-8, Apr. 12, 2019.

Taillaert et al., "An Out-of-Plane Grating Coupler for Efficient Butt-Coupling Between Compact Planar Waveguides and Single-Mode Fibers", IEEE Journal of Quantum Electronics, vol. 38, No. 7, pp. 949-955, Jul. 2002.

Hoessbacher et al., "Optical Interconnect Solution With Plasmonic Modulator and Ge Photodetector Array," IEEE Photonics Technology Letters, vol. 29, pp. 1760-1763, Nov. 1, 2017.

Hoessbacher et al., "Plasmonic modulator with >170 GHz bandwidth demonstrated at 100 GBd NRZ", Optics Express Journal, vol. 25, No. 3, pp. 1762-1768, Feb. 6, 2017.

Messner et al., "Integrated Ferroelectric Plasmonic Optical Modulator," Optical Society of America, paper TH5C.7, pp. 1-3, year 2017.

Haffner et al., "Low-loss plasmon-assisted electro-optic modulator," Nature, vol. 556, pp. 1-17, year 2018.

Uhl et al., "A 100 Gbit/s 2Vpp Power Multiplexer in SiGe BiCMOS Technology for Directly Driving a Monolithically Integrated Plasmonic MZM in a Silicon Photonics Transmitter," 2017 IEEE Bipolar/BiCMOS Circuits and Technology Meeting (BCTM), pp. 106-109, year 2017.

Babicheva et a., "Transparent conducting oxides for electro-optical plasmonic modulators," Nanophotonics, vol. 4, issue 1, pp. 165-185, year 2015.

International Application # PCT/GR2019/000039 Search Report dated Mar. 9, 2020.

Hoessbacher et al., International Application # PCT/GR2019/000039 filed Jun. 10, 2019.

Sun et al., "Single-chip microprocessor that communicates directly using light", Nature, vol. 417, pp. 534-538, Dec. 24, 2015.

Fukuda et al., "Plasmonic and electronic device integrated circuits and their characteristics", 45th European Solid State Device Research Conference (ESSDERC), pp. 105-108, Sep. 14, 2015.

Moazeni et al., "A 40-GB/s PAM-4 Transmitter Based on a Ring-Resonator Optical DAC in 45-nm SOI CMOS", IEEE Journal of Solid-State Circuits, vol. 52, issue 12, pp. 3503-3516, Dec. 2017.

Akhter et al., "WaveLight: A Monolithic Low Latency Silicon-Photonics Communication Platform for the Next-Generation Disaggregated Cloud Data Centers", IEEE 25th Annual Symposium on High-Performance Interconnects (HOTI), pp. 25-28, Aug. 28-30, 2017.

Haffner et al., "All-plasmonic Mach-Zehnder modulator enabling optical high-speed communication at the microscale", Nature Photonics, vol. 9, pp. 1-5, Jul. 27, 2015.

Larsson et al., "VCSEL modulation speed: status and prospects", Proceedings of SPIE OPTO, vol. 10938, pp. 1-7, Mar. 1, 2019.

* cited by examiner

INTEGRATION OF MODULATOR AND LASER IN A SINGLE CHIP

FIELD OF THE INVENTION

The present invention relates generally to optoelectronic devices, and particularly to high-speed modulated light sources.

BACKGROUND

Fiberoptic communications rely on high-speed temporal modulation of light for achieving data rates of hundreds of Gb/s per communication channel. Commonly-used light sources for fiberoptic communications comprise light-emitting diodes (LEDs) and laser diodes, typically emitting in the infrared (IR) region of the spectrum in order to match the transmission windows of optical fibers. (The terms "optical rays," "optical radiation," and "light," as used in the present description and in the claims, refer generally to any and all of visible, infrared, and ultraviolet radiation.) The modulation of the emitted light may be accomplished either by direct modulation, wherein the excitation current of the light source is modulated, or by an external optical modulator, such as an electro-absorption modulator or a Mach-Zehnder interferometric modulator. When an external modulator is used, the light source may be operated in a continuous-wave (CW) mode.

Vertical-cavity surface-emitting lasers (VCSELs) are commonly used as light sources in fiberoptic communications. The highest demonstrated direct modulation speed of a stand-alone VCSEL is 37 GHz, yielding a maximal data rate of 74 Gb/s. It may be possible to achieve higher data rates, in the region of hundreds of Gb/s, by integration of an external modulator with the VCSEL.

Plasmonic modulators have been proposed as a possible solution to the need for higher modulation speed. Modulators of this sort are based on the interaction between surface plasmon polaritons (SPPs) and externally applied electric fields. Surface plasmon polaritons are generated at the interface between a dielectric material and a metal, and can be directly excited by light beams. Application of a rapidly-varying electric field to the metal causes a corresponding modulation of the SPPs, which in turn translates into modulation of the light beam at the end of the plasmonic regime. The term "plasmonic modulator" is used in the present description and in the claims to refer to devices that apply an electric field to modulate surface plasmon polaritons, which are then converted back to light beams at the end of the plasmonic regime.

Plasmonic modulators based on the above principles have been demonstrated experimentally and described in the patent literature, but they are still far from commercial deployment. For example, PCT International Publication WO 2011/162719 describes a metal-oxide-semiconductor plasmonic slot waveguide, which includes a silicon layer, a silicon oxide layer laterally disposed next to a first side wall of the silicon layer, a first metal layer laterally disposed next to the silicon oxide layer, and a second metal layer laterally disposed next to a second side wall of the silicon layer, wherein the second side wall is opposite to the first side wall. A plasmonic mode can propagate along the slot waveguide, and the propagating characteristics can be adjusted by the voltage applied on the metal layers. A metal-oxide-semiconductor plasmonic modulator includes first and second metal-oxide-semiconductor plasmonic slot waveguides of this sort.

A fast plasmonic Mach-Zehnder modulator is described by Burla et al., in "500 GHz plasmonic Mach-Zehnder modulator enabling sub-THz microwave photonics," published in *APL Photonics* 4, 056106 (2019).

SUMMARY

Embodiments of the present invention that are described hereinbelow provide improved designs of and fabrication methods for high-speed modulated light sources.

There is therefore provided, in accordance with an embodiment of the invention, an optoelectronic device, including a substrate and first thin film layers disposed on the substrate and patterned to define a vertical-cavity surface-emitting laser (VCSEL), which is configured to emit optical radiation along an optical axis perpendicular to the substrate. Second thin film layers are disposed over the first thin film layers and are patterned to define an optical modulator in which the optical radiation propagates in a direction parallel to the substrate, and an optical coupler configured to couple the optical radiation from the VCSEL into the optical modulator.

In a disclosed embodiment, the optical coupler includes a grating formed in the second thin film layers. Additionally or alternatively, the optical coupler includes a first optical coupler disposed over the optical axis of the VCSEL, and the second thin film layers are patterned to define a second optical coupler configured to couple the optical radiation out of the optical modulator.

In some embodiments, the first thin film layers extend across a predefined area of the substrate and are patterned to define the VCSEL at a first location in proximity to a first edge of the area, while the second thin film layers are patterned so that the optical radiation that has propagated through the modulator exits the device at a second location in proximity to a second edge of the area, opposite the first edge. In one embodiment, the first thin film layers include an aperture disposed on the optical axis, which is aligned with the optical coupler in proximity to the first edge of the area. The aperture may include a tunnel junction.

Typically, the first thin film layers include a lower distributed Bragg-reflector (DBR) disposed over the substrate, a multiple-quantum-well (MQW) stack, disposed over the lower DBR, and an upper DBR disposed over the MQW stack.

In a disclosed embodiment, the optical modulator is configured to modulate the optical radiation by plasmonic modulation. Additionally or alternatively, the optical modulator includes a Mach-Zehnder modulator.

There is also provided, in accordance with an embodiment of the invention, a method for producing an optoelectronic device. The method includes depositing and patterning first thin film layers on a substrate so as to define a vertical-cavity surface-emitting laser (VCSEL), which is configured to emit optical radiation along an optical axis perpendicular to the substrate. Second thin film layers are deposited over the first thin film layers and are patterned so as to define an optical modulator in which the optical radiation propagates in a direction parallel to the substrate, and an optical coupler configured to couple the optical radiation from the VCSEL into the optical modulator. The present invention will be more fully understood from the following detailed description of the embodiments thereof, taken together with the drawings in which:

DETAILED DESCRIPTION OF EMBODIMENTS

Figure 1:
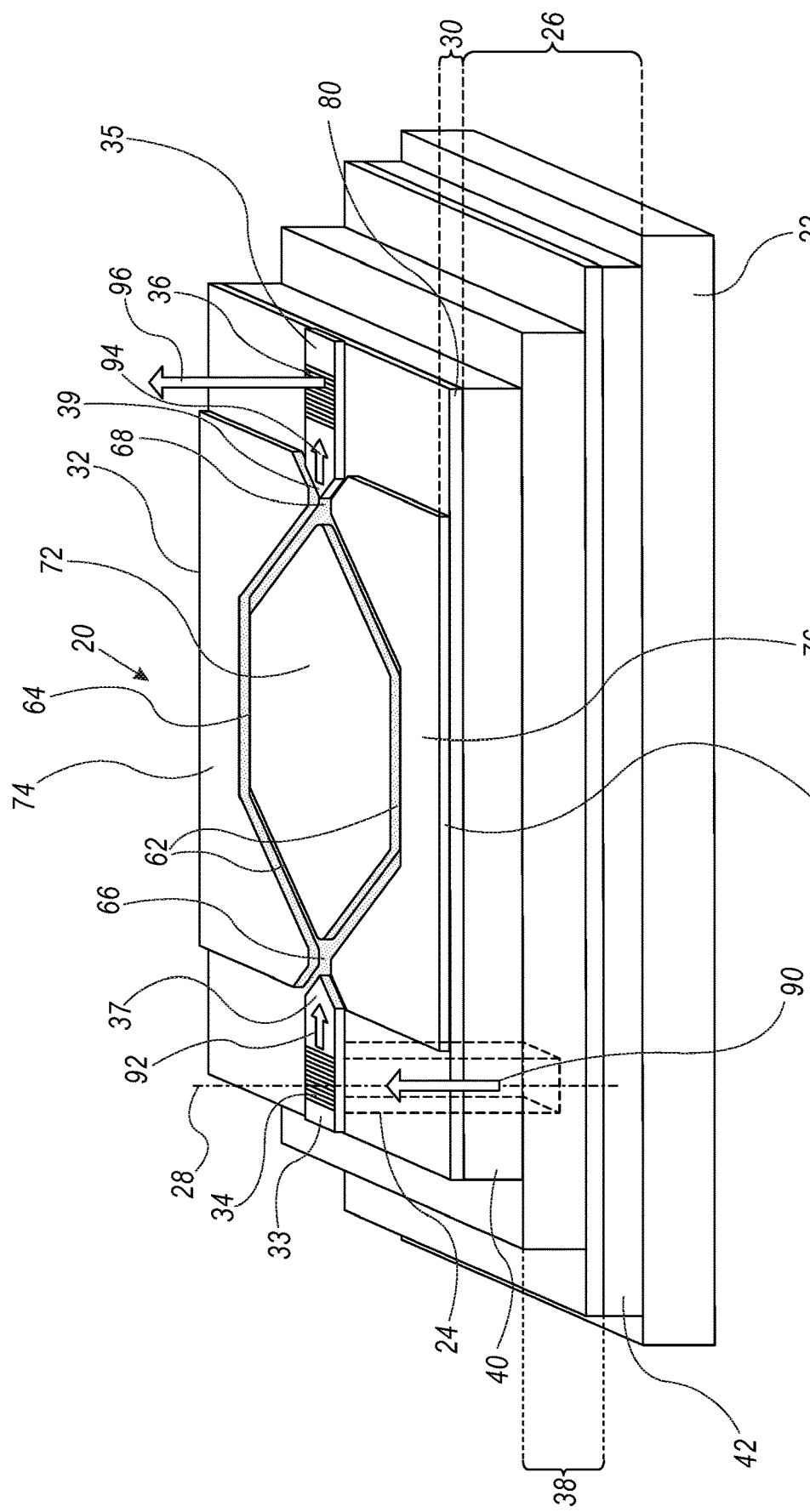
FIG. 1 is a schematic pictorial illustration of a vertically-integrated source/modulator module, in accordance with an embodiment of the invention.

VCSELs with integrated optical modulators are capable, in principle, of producing optical communication signals with data rates well in excess of 100 Gb/s. To realize the advantages of such integrated source/modulator modules in practical devices, however, it is necessary to design these modules for efficient operation, as well as for fabrication using established semiconductor fabrication methods.

Embodiments of the present invention that are described herein address this need by providing a vertically-integrated source/modulator device. The module comprises a VCSEL, which formed by depositing and patterning a first set of thin film layers on the substrate. The VCSEL emits optical radiation along an optical axis perpendicular to the substrate. A second set of thin film layers is deposited over the first set and is patterned to define an optical modulator in which optical radiation propagates in a direction parallel to the substrate, together with an optical coupler, positioned over the optical axis of the VCSEL, to couple the optical radiation from the VCSEL into the optical modulator. Typically (although not necessarily), the second set of thin film layers is also patterned to define a further optical coupler, which couples the modulated radiation out of the modulator, for example into an optical fiber or other waveguide. (The terms "thin film" and "thin film layer," as used in the context of the present description and in the claims, refer to a layer of material ranging from less than 1 nm up to 10 μm in thickness.)

In the disclosed embodiments, the modulator comprises a plasmonic Mach-Zehnder modulator, as modulators of this kind are physically capable of modulating light at data rates well in excess of 100 Gb/s. Furthermore, due to the increased light-matter interaction exhibited by surface plasmon polaritons (SPPs), plasmonic devices can apply deep modulation to an incident light beam over very short interaction lengths, while requiring only moderate excitation voltages, thus enabling the fabrication of small source/modulator modules.

In alternative embodiments, the second set of thin film layers may be deposited and patterned to define other types of modulators. For example, the modulator may comprise a plasmonic electro-absorption modulator or a ring modulator.

In a disclosed embodiment, in order to produce this sort of device, the first set of thin film layers extend across a relatively wide area of the substrate, but are patterned to define the VCSEL in a narrower area, at a location in proximity to an edge of the area of the first layer set. The layers in the second set extend across most or all of the wide area of the first set of layers. These latter layers are patterned so that the optical radiation that is coupled from the VCSEL into the modulator by the optical coupler propagates through the modulator across the area of the device and then exits the device at a location in proximity to a second edge of the area, opposite the edge where the VCSEL is located.

FIG. 1 is a schematic pictorial illustration of a vertically-integrated source/modulator module 20, in accordance with an embodiment of the invention. In FIG. 1, as well as in the subsequent figures, the various details (for example layer thicknesses) are not shown in true scale with respect to each other.

Source/modulator module 20 is fabricated on a semiconductor substrate 22, for example a GaAs (gallium arsenide) substrate. A VCSEL 24 is formed in first thin film layers 26 disposed on substrate 22. VCSEL 24 is shown schematically as a dotted-line right-angle parallelepiped, and it emits optical radiation, indicated by an arrow 90, along an optical axis 28, which is perpendicular to substrate 22. Second thin film layers 30 are disposed over first thin film layers 26. The second thin film layers comprise a plasmonic Mach-Zehnder modulator 32, input and output strip waveguides 33 and 35, and input and output grating couplers 34 and 36. Strip waveguides 33 and 35 are optically coupled to Mach-Zehnder modulator 32 with respective tapered input and output couplers 37 and 39.

Input grating coupler 34, input strip waveguide 33, and tapered input coupler 37 function together as a coupler for coupling the optical radiation from VCSEL 24 into modulator 32. Similarly, output grating coupler 36, output strip waveguide 35, and tapered output coupler 39 function together as a coupler for coupling the optical radiation from modulator 32 out of module 20. (For efficient coupling by the grating couplers, VCSEL 24 is assumed to operate in a fundamental mode with stable polarization.) Alternatively, as noted earlier, module 20 may comprise modulators of other types, as well as different types of couplers, such as prisms, mirrors, waveguides, or holographic couplers.

In FIG. 1, the cross-sectional area of VCSEL 24 (perpendicular to optical axis 28) is drawn to be of the same transverse dimensions as input grating coupler 34. However, a condition for a proper functioning of module 20 is only that input grating coupler 34 be sufficiently large to capture the optical radiation emitted by VCSEL 24.

Figure 2:
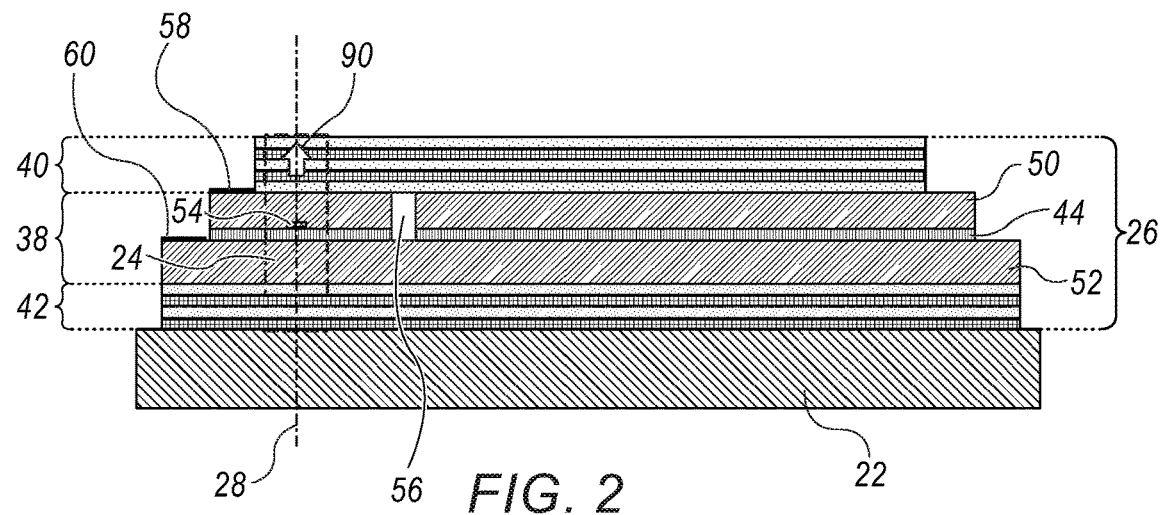
FIGS. 2, 3 and 4 are schematic sectional views of the module of FIG. 1 showing successive stages in fabrication of the module, in accordance with an embodiment of the invention.

First thin film layers 26 comprise an active cavity 38, which is sandwiched between an upper DBR (distributed Bragg reflector) 40 and a lower DBR 42, for example by wafer bonding. DBRs 40 and 42 each comprise alternating layers of high- and low-refractive index materials, for example, AlGaAs (aluminum gallium arsenide) and GaAs (gallium arsenide). Further details of these layers are shown in FIG. 2.

Plasmonic Mach-Zehnder modulator 32 has the form of a Mach-Zehnder interferometer, comprising a bifurcated slot waveguide 62 for propagating the SPPs. Waveguide 62 splits into two parallel legs at a Y-junction near an input end 66 of modulator 32, which then rejoin at another Y-junction near an output end 68. The slots of waveguide 62 are formed in a metal layer 70 disposed on a dielectric layer 80, with the slots also defining a common central electrode 72 and excitation electrodes 74 and 76 on opposing sides of the modulator. Metal layer 70 comprises, for example, gold (Au), and dielectric layer 80 comprises, for example, silicon dioxide ($SiO_2$). Slot waveguide 62 is filled with a composite organic electro-optical material (OEO) 64, such as HD-BB-OH/YLD124, wherein HD-BB-OH refers to aromatic dendron (HD) hydroxyl (OH) with a modified bridge (BB), and YLD124 is a nonlinear optical (NLO) chromophore. Alternatively, other sorts of electro-optical materials may be used.

Figure 3:
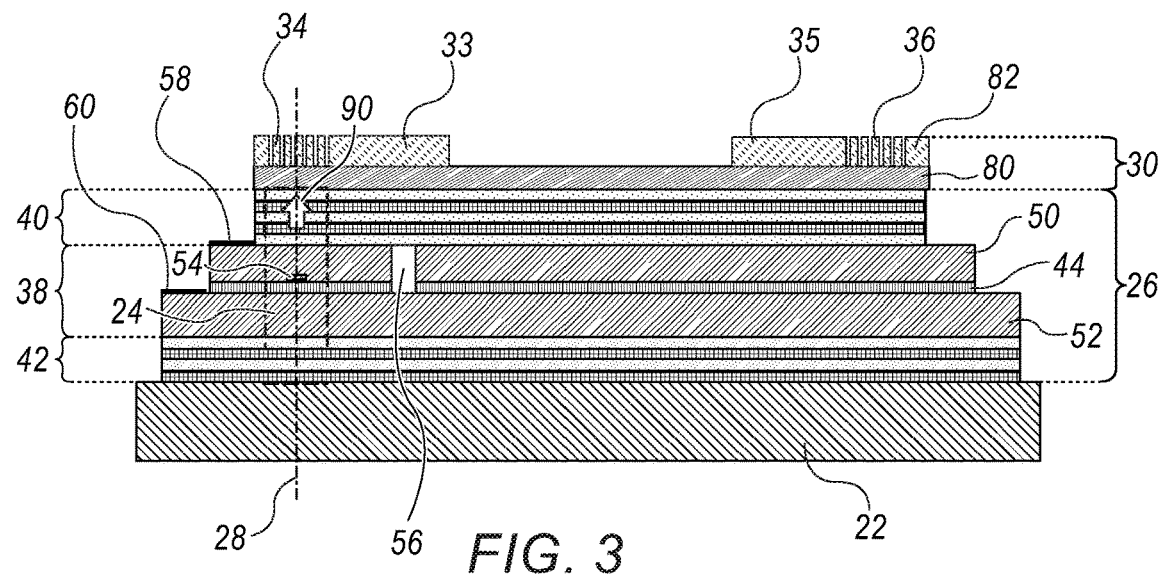

Strip waveguides 33 and 35, as well as grating couplers 34 and 36, are formed in a silicon (Si) layer 82, as further detailed in FIG. 3.

For the purpose of coupling the radiation emitted by VCSEL 24 into SPPs in modulator 32, the modulator is positioned so that its input end 66 is in proximity to optical axis 28, alongside input grating coupler 34.

A plasmonic Mach-Zehnder modulator of this sort is described, for example, in PCT Patent Application PCT/GR2019/000039, filed Jun. 10, 2019, whose disclosure is incorporated herein by reference. Although the methods of fabrication of the modulator described in this PCT application are different from those in the present patent application, the physical components and mode of operation of the modulators are similar.

In an embodiment of the present invention, the slots of waveguide 62 are about 100-200 nm deep, 75-100 nm wide, and 10-25 µm long; however, these dimensions are presented solely by way of example, and larger or smaller dimensions may alternatively be used. Central electrode 72 may be grounded, for example, while excitation electrodes 74 and 76 are driven by signals with different respective phases, such as a drive signal S on electrode 74 and its inverse $\tilde{S}$ on electrode 76. The drive signals are typically in the range of a few volts peak-to-peak, but larger or smaller voltages may alternatively be used depending on application requirements.

Due to the small size of modulator 26 32 (10-25 µm slot length) and the vertical operation of VCSEL 24, the entire module 20 may be fabricated with lateral dimensions not exceeding 1 mm.

The radiation emitted by VCSEL 24, indicated by arrow 90, impinges on input grating coupler 34, which diffracts and couples the radiation via input strip waveguide 33 into modulator 32 in a direction parallel to substrate 22, as indicated by an arrow 92. This radiation propagates in waveguide 62, and is modulated responsively to electrical drive signals S and $\tilde{S}$ applied to excitation electrodes 74 and 76, respectively. The modulated radiation, indicated by an arrow 94, is coupled via output strip waveguide 35 into output grating coupler 36, which diffracts the modulated radiation out of module 20, as indicated by an arrow 96.

In the disclosed embodiment, the radiation output from modulator 32, indicated by an arrow 96, may be modulated at frequencies exceeding 100 GHz, while VCSEL 24 is operated at a low continuous-wave current (<10 mA).

FIG. 2 is a schematic sectional view of module 20 after completing the fabrication of VCSEL 24, in accordance to an embodiment of the invention. Further details of the design and fabrication of VCSEL 24 are described in U.S. Pat. No. 10,396,527, whose disclosure is incorporated herein by reference. Alternatively, the layers of VCSEL 24 may comprise different materials and may be fabricated by other suitable processes that are known in the art.

The lateral dimensions of substrate 22 and first thin film layers 26 are selected so as to provide a sufficiently large basis for modulator 32 and grating couplers 34 and 36, which will be disposed and patterned over the first thin film layers in subsequent fabrication steps. Layers 26 are patterned so as to form VCSEL 24 at a location in proximity to one edge of the area of these layers, below the intended location of grating coupler 34. (Thin film layers 30 will then be patterned so that the optical radiation that has propagated through modulator 32 exits module 20 at the location of coupler 36, in proximity to the opposite edge of layers 26.) The numerical labels of FIG. 1 are used in FIG. 2, as well as in the subsequent figures, to indicate similar or identical items.

As shown in FIG. 2, active cavity 38 incorporates a multiple-quantum-well (MQW) stack 44 and top and bottom n-type InP intra-cavity current spreading layers 50 and 52, respectively. MQW stack 44 comprises a series of quantum wells disposed between a series of barriers. For example, MQW stack 44 may comprise alternating InAlGaAs quantum wells and InAlGaAs barriers. A re-grown $p^{++}/n^{++}$ tunnel junction 54 defines the optical and electrical current aperture of VCSEL 24. Layers 26 are etched, along with an internal isolation structure 56, such as an air gap, to define the mesa structure of VCSEL 24. Electrodes 58 and 60 are deposited on exposed areas of current spreading layers 50 and 52 for coupling an electrical current into these layers for driving VCSEL 24. An additional airgap and intra-cavity elements may be formed in the optical path of VCSEL 24, as described in the above-mentioned U.S. Pat. No. 10,396,527, in order to tune and stabilize the VCSEL (but these elements are beyond the scope of the present disclosure and are omitted from the figures for the sake of simplicity).

FIG. 3 is a schematic sectional view of module 20 after forming strip waveguides 33 and 35 and grating couplers 34 and 36, in accordance with an embodiment of the invention. $SiO_2$ layer 80 is first deposited for isolating modulator 32 from first thin film layers 26. Si layer 82 is then deposited over $SiO_2$ layer 80 and patterned to form grating couplers 34 and 36, as well as strip waveguides 33 and 35 and tapered couplers 37 and 39. For patterning Si layer 82, a layer of photoresist is deposited on it and exposed, for example using deep-UV (193 nm wavelength) lithography. This exposure opens areas in the photoresist corresponding to those parts of Si layer 82 that are to be removed for generating the three-dimensional patterns for the grating couplers, strip waveguides, and tapered couplers. Next, the areas of Si layer 82 under the opened areas are etched in a dry etch process, such as reactive ion etching. Dry etching removes the silicon from the exposed areas of Si layer 82 down to $SiO_2$ layer 80.

The lithographic patterning defines strip waveguides 33 and 35 with a typical width of 450 nm and a thickness of Si layer 82, for example 220 nm. These dimensions are cited by way of example only, and other dimensions may be used in alternative embodiments. Grating coupler 34 is patterned to diffract the optical radiation from VCSEL 24 into input strip waveguide 33, as shown by arrows 90 and 92 (FIG. 1). Grating coupler 36 is patterned to diffract the optical radiation from output strip waveguide 35 out of module 20, as shown by arrows 94 and 96. As noted earlier, input grating coupler 34 is disposed over optical axis 28 of VCSEL 24, in proximity to input end 66, and output grating 36 is disposed in proximity to output end 68. Tapered couplers 37 and 39 are designed to provide adiabatic coupling from input strip waveguide 33 to modulator 32 and from modulator 32 to output strip waveguide 35, respectively.

Figure 4:
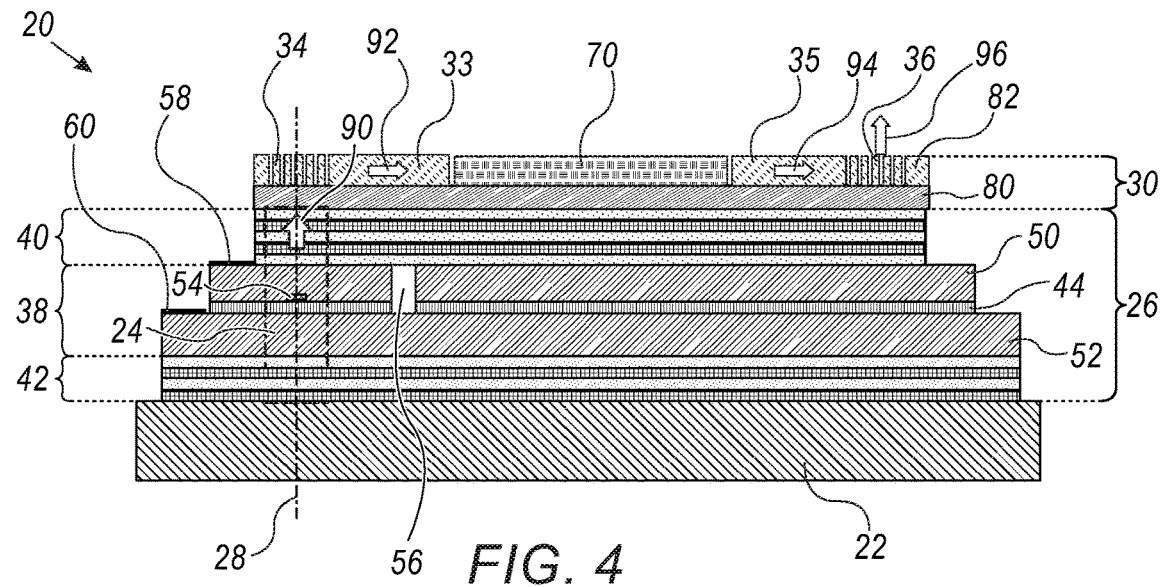

FIG. 4 is a schematic sectional view of module 20 after completion of the module, in accordance with an embodiment of the invention.

Metal layer 70 has been deposited on $SiO_2$ layer 80. As shown in FIG. 1 layer 70 is patterned to form electrodes 72, 74, and 76, simultaneously forming slot waveguides 62. Slot waveguides 62 have been filled with OEO 64, thus completing module 20. The propagation of light, starting from VCSEL 24 through the output from module 20, is shown, similarly to FIG. 1, by arrows 90, 92, 94, and 96.

Although the figures and description above relate, for the sake of concreteness and clarity, to a particular device 20, with certain specific types of emitter, modulator, and couplers, the principles of the present invention may likewise be applied in the design and fabrication of devices using emitters, couplers and plasmonic modulators of other types that are known in the art. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
   a substrate;
   first thin film layers disposed on the substrate and patterned to define a vertical-cavity surface-emitting laser (VCSEL), which is configured to emit optical radiation along an optical axis perpendicular to the substrate; and
   second thin film layers, disposed over the first thin film layers and patterned to define:
      an optical modulator in which the optical radiation propagates in a direction parallel to the substrate; and
      an optical coupler configured to couple the optical radiation from the VCSEL into the optical modulator,
   wherein the substrate and first thin film layers have lateral dimensions sufficiently large to provide a basis for the optical modulator and the optical coupler in the second thin film layers.

2. The device according to claim 1, wherein the optical coupler comprises a grating formed in the second thin film layers.

3. The device according to claim 1, wherein the optical coupler comprises a first optical coupler disposed over the optical axis of the VCSEL, and wherein the second thin film layers are patterned to define a second optical coupler configured to couple the optical radiation out of the optical modulator.

4. The device according to claim 1, wherein the first thin film layers extend across a predefined area of the substrate and are patterned to define the VCSEL at a first location in proximity to a first edge of the area, while the second thin film layers are patterned so that the optical radiation that has propagated through the modulator exits the device at a second location in proximity to a second edge of the area, opposite the first edge.

5. The device according to claim 4, wherein the first thin film layers comprise an aperture disposed on the optical axis, which is aligned with the optical coupler in proximity to the first edge of the area.

6. The device according to claim 5, wherein the aperture comprises a tunnel junction.

7. The device according to claim 1, wherein the first thin film layers comprise:
   a lower distributed Bragg-reflector (DBR) disposed over the substrate;
   a multiple-quantum-well (MQW) stack, disposed over the lower DBR; and
   an upper DBR disposed over the MQW stack.

8. The device according to claim 1, wherein the optical modulator is configured to modulate the optical radiation by plasmonic modulation.

9. The device according to claim 1, wherein the optical modulator comprises a Mach-Zehnder modulator.

10. A method for producing an optoelectronic device, the method comprising:
    depositing and patterning first thin film layers on a substrate so as to define a vertical-cavity surface-emitting laser (VCSEL), which is configured to emit optical radiation along an optical axis perpendicular to the substrate; and
    depositing and patterning second thin film layers over the first thin film layers so as to define:
       an optical modulator in which the optical radiation propagates in a direction parallel to the substrate; and
       an optical coupler configured to couple the optical radiation from the VCSEL into the optical modulator,
    wherein the substrate and first thin film layers have lateral dimensions sufficiently large to provide a basis for the optical modulator and the optical coupler in the second thin film layers.

11. The method according to claim 10, wherein the optical coupler comprises a grating formed in the second thin film layers.

12. The method according to claim 10, wherein patterning the second thin film layers comprises forming a first optical coupler over the optical axis of the VCSEL, to couple the optical radiation from the VCSEL into the optical modulator, and forming a second optical coupler configured to couple the optical radiation out of the optical modulator.

13. The method according to claim 10, wherein the first thin film layers are deposited across a predefined area of the substrate and are patterned to define the VCSEL at a first location in proximity to a first edge of the area, while the second thin film layers are patterned so that the optical radiation that has propagated through the modulator exits the device at a second location in proximity to a second edge of the area, opposite the first edge.

14. The method according to claim 13, wherein patterning the first thin film layers comprises forming an aperture on the optical axis, which is aligned with the optical coupler in proximity to the first edge of the area.

15. The method according to claim 14, wherein the aperture comprises a tunnel junction.

16. The method according to claim 10, wherein depositing and patterning the first thin film layers comprise:
    depositing a lower distributed Bragg-reflector (DBR) over the substrate;
    depositing a multiple-quantum-well (MQW) stack over the lower DBR; and
    depositing an upper DBR over the MQW stack.

17. The method according to claim 10, wherein the optical modulator is configured to modulate the optical radiation by plasmonic modulation.

18. The method according to claim 10, wherein the optical modulator comprises a Mach-Zehnder modulator.

* * * * *